(12) United States Patent
Metz et al.

(10) Patent No.: US 8,148,195 B2
(45) Date of Patent: Apr. 3, 2012

(54) PROCESS FOR PRODUCING A CONTACT AREA OF AN ELECTRONIC COMPONENT

(75) Inventors: Axel Metz, Alzenau (DE); Stefan Bagus, Flieden (DE); Stefan Dauwe, Blankenbach (DE); Tobias Droste, Darmstadt (DE); Peter Roth, Hanau (DE); Andreas Teppe, Constance (DE)

(73) Assignee: Schott Solar AG, Mainz (DE)

( * ) Notice: Subject to any disclaimer, the term of this patent is extended or adjusted under 35 U.S.C. 154(b) by 36 days.

(21) Appl. No.: 12/880,198

(22) Filed: Sep. 13, 2010

(65) Prior Publication Data

US 2011/0065231 A1 Mar. 17, 2011

(30) Foreign Application Priority Data

Sep. 17, 2009 (DE) .................... 10 2009 044 038

(51) Int. Cl.
*H01L 21/00* (2006.01)
(52) U.S. Cl. ........... 438/98; 257/E21.159; 257/E21.475; 257/E21.592

(58) Field of Classification Search .................. 438/98, 438/690, 707, 709, 48, 82, 89, 598, 610, 438/612, 660, 661, 662, 761, FOR. 196, FOR. 28, 438/4, FOR. 365; 257/48, 82, 89, 98, 598, 257/610, 612, 660, 661, 662, 761, FOR. 196, 257/FOR. 28, 4, FOR. 365
See application file for complete search history.

(56) References Cited

U.S. PATENT DOCUMENTS

| 3,828,276 | A | * | 8/1974 | Cohen | 372/13 |
| 6,057,234 | A | * | 5/2000 | Yamazaki | 438/660 |
| 2009/0305457 | A1 | * | 12/2009 | Lin et al. | 438/98 |
| 2011/0197965 | A1 | * | 8/2011 | Finarov et al. | 136/256 |

* cited by examiner

*Primary Examiner* — Julio J Maldonado
*Assistant Examiner* — Quovaunda V Jefferson
(74) *Attorney, Agent, or Firm* — Dennison, Schultz & MacDonald

(57) ABSTRACT

A process for forming at least one local contact area of a substrate of an electrical component for contacting the contact area with a connector, in which the substrate, on the contact side, is provided with a sintered porous metal layer. To make available a mechanically durable, electrically faultless solderable contact area, it is proposed that the porous layer be compacted and/or removed in the contact area to be formed.

15 Claims, 1 Drawing Sheet

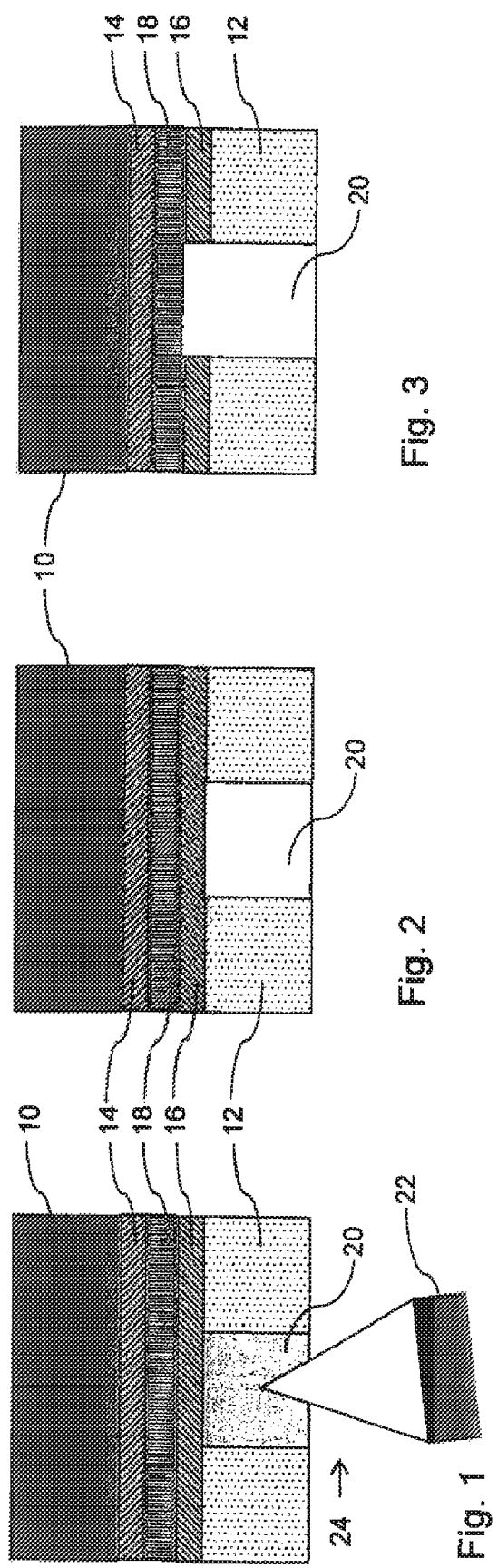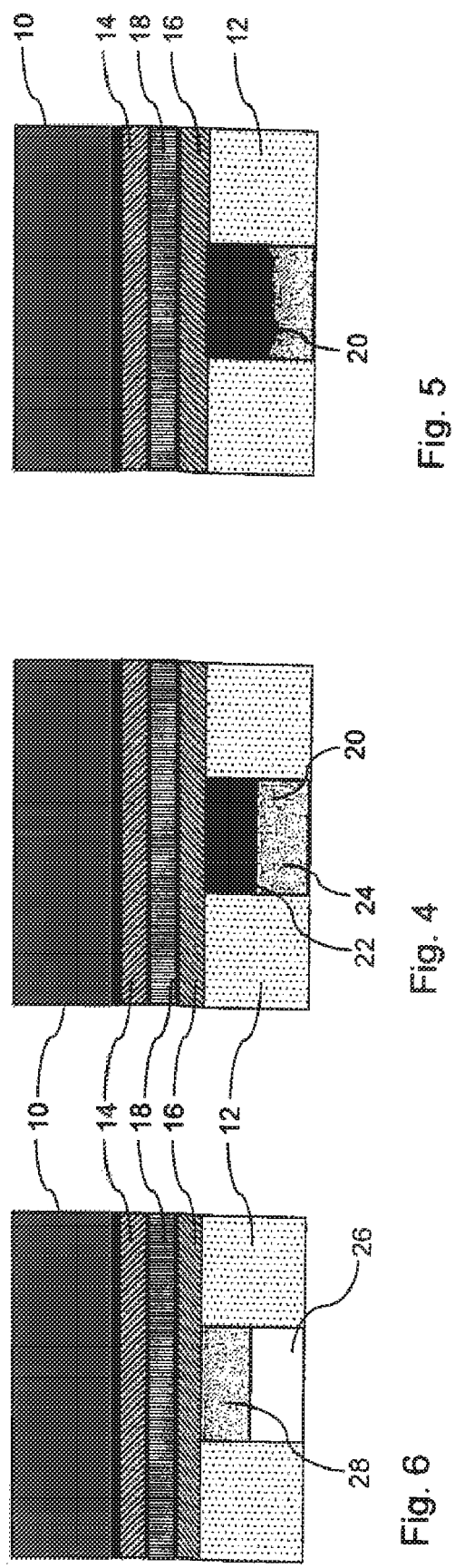

PROCESS FOR PRODUCING A CONTACT AREA OF AN ELECTRONIC COMPONENT

BACKGROUND OF THE INVENTION

The invention relates to a process for production of at least one local contact area of a substrate of an electronic component for contact of the area with a connector, wherein the substrate is provided on the contact side with a sintered porous layer that consists of aluminum or contains aluminum.

In semiconductor manufacture, especially production of solar cells, sintered metal contacts are used on the front or rear side of the cell for reasons of production costs.

Usually on the rear side of a silicon solar cell there is a large-area aluminum layer, which, during the manufacture of the solar cell, through heat treatment, is subject to a sintering process, by which simultaneously the rear side of the solar cell is passivated by a so-called back surface field (BSF).

During sintering, the aluminum layer which is in direct contact with the silicon substrate to be designated as the first layer, is melted on at the boundary surface between the aluminum layer and the silicon substrate, and alloyed with the adjoining first layer. During cooling, a silicon layer highly doped with Al congeals in epitaxial fashion on the rear side of the wafer, thus of the substrate. Simultaneous with this, an Al layer enriched with silicon congeals on the Al layer, and at the end of the cooling process, an Al—Si eutectic congeals between the layer highly doped with aluminum and the layer enriched with silicon. The epitaxially grown silicon layer highly doped with aluminum is responsible for the passivation of the rear side of the solar cell. Due to high Al doping, in the semiconductor material of the layer, an excess of negatively charged, fixed location Al acceptors is formed, from which an electric field repulsing the minority carriers is generated, the so-called back surface field.

If the aluminum layer extends over the entire back side of the solar cell or of the substrate, there is, however, a soldering problem, because it is not readily possible directly to solder on tin-plated or non-tin-plated metal connectors, especially copper connectors, on the aluminum back side. To carry out the required electrical contacting in spite of this, normally silver contact strip conductors or soldering points are applied directly onto the substrate surface by screen printing, pad printing or other suitable printing processes and the tin-plated copper bands are soldered onto these. Consequently, in the area of the soldered contact, a recess is provided in the aluminum layer with the result that in this area, no back surface field can form, so that the solar cell rear surface is not completely electrically passivated, and small local photostreams can result.

Because silver is an expensive raw material, it should be dispensed with to reduce manufacturing costs. Therefore it is desirable to avoid the Ag contact altogether.

Direct soldering of the contact bands on the aluminum layer is difficult for several reasons. One reason is the oxidized surface of the Al particles. Another reason is that due to the sintering process, the upper aluminum side is not formed to be sufficiently continuous. Thus, during the sintering process, over the alloy layer doped with Si, an Al layer is produced in the form of spherical Al particles (sintered layer) sintered together from individual particles, in which there is no closed bond of aluminum, but rather a relatively loosely sintered one, which is more or less porous depending on the composition of the aluminum paste or the process parameters during sintering.

If despite this, success were achieved in soldering onto this sintered aluminum layer, nonetheless due to the porosity and the instability of the layer caused by this, only a very slight hold would be obtained. This slight hold reveals itself in small withdrawal forces of about 2-8 N, with the sintered layer torn apart, so that on both sides of the tear location one would detect the spherical structure of the particles.

The same thing happens if the soldered connection on the aluminum layer is subject to tensile forces acting in a module under operating conditions. Small tears can result, causing the soldered location to have little holding capacity, and also could result in higher transitional resistances, or the connection can tear off as a whole and the mechanical and electrical contact is totally destroyed.

From DE-A-10 2007 012 277, a procedure is known for manufacturing a solar cell. In one procedural step, a large aluminum area is applied to the rear side of the semiconductor substrate and is alloyed into it. The aluminum not alloyed into the silicon is removed at least in some areas in an etching step. This requires processing expenses which have a negative impact on manufacturing of solar cells as part of a production line.

EP-A-1 739 690 relates to a solar cell in which, after a back surface field is formed, a previously formed sintered aluminum layer is chemically removed.

According to U.S-A-2003/0108664, to manufacture electrically conducting contacts on solar cells, a precursor mixture is applied. This may contain aluminum. To sinter the material, a pulsed layer beam can be used.

To apply electrical contacts to semiconductor substrates, DE-B-10 2006 040 352 makes a provision to sinter applied metal powder onto the semiconductor substrate by means of a laser beam. Non-sintered material is then removed.

To produce metallic semiconductor contacts according to EP-A-2 003 699, a solderable material is sintered into a sintered aluminum layer applied to a solar cell.

SUMMARY OF THE INVENTION

The object of the invention is to further develop a procedure of the type named initially, so that a mechanically durable electrical contact area, able to be faultlessly attached and soldered, is made available. In comparison to prior art, the process should be simplified.

According to the invention, the problem is solved by compacting and/or removing the sintered porous layer in the contact area in non-contact fashion with concentrated electromagnetic radiation, preferably laser radiation.

Provision is especially made that the area is impinged on by concentrated electromagnetic radiation, preferably laser radiation.

On the basis of the invention-specific teaching, it has been shown in surprising fashion that through impingement with concentrated electromagnetic radiation, preferably laser radiation, and local compaction or removal of material of the sintered porous layer that results from this, a contact area can be formed that makes possible a mechanically stable circuitry by means of known connecting techniques such as ultrasonic soldering. The sintered porous aluminum layer provides an advantage in that it can be compressed to an extent that results in a scratch-proof aluminum surface with outstanding mechanical adherence. Consequently, it is not required to form a soldered contact made of a material other than aluminum, for example in a masking technique, so that as a consequence the inherent disadvantage with a solar cell as a component, that the back surface field is interrupted in the area of the contact, is avoided.

The compacting yields an area that is more mechanically stable than a porous layer of the same material.

Provision is especially made that the sintered porous layer is impinged on by concentrated electromagnetic radiation of a wavelength λ of 200 nm≦λ≦11,000 nm.

In preferred fashion, for contact-free compaction or removal of areas of the porous layer, a laser is used that emits infrared radiation at a wavelength λ≧800 nm, preferably λ≧1000 nm, preferably at λ=1064 nm, especially in the near infrared range. Preferably a solid-state laser like an Nd:YVO$_4$ laser or Nd:YAG laser is used. Especially preferred is a solid state laser that emits laser radiation at a wavelength λ=1064 nm.

When forming the contact area or areas, the laser should operate in pulsed or Q-switched mode. To focus the energy over a defined area, and to avoid hot spots, provision is additionally made that when the back electrode layer is structured, the laser beam has a top hat-shaped beam profile.

For influencing the beam profile, as an alternative or supplement, provision is made that between the laser and the substrate a beam conversion device like refractive or diffractive optics or a screen is placed.

Especially a laser beam should be used of a wavelength at which the optical absorption of the porous layer is at least 0.5%, especially at least 10%.

A wavelength should be used that is absorbed in the sintered porous layer to heat it in such a way that in the area of the impinged laser beam, the layer is vaporized for formation of the contact area.

Instead of laser radiation, thermal energy can be used through any contactless radiation energy such as light of any desired wavelength focused through lenses or mirrors.

In supplementary fashion, the term compaction is to be understood as treatment of the layer material, to attain an increase in density of at least 10% and at most 100%. A 100% increase in density means that the layer, or areas of it, are fully melted by the energy input and thus a layer, such as a crystalline one, is generated, which no longer is porous, i.e., is 100% dense.

What is meant by removal is treatment of the sintered porous layer, through which it removed in part or in its entirety. Partial removal fundamentally should include at least 10% of the original layer thickness of the sintered porous layer being removed. Complete removal means that no porous component areas of the original layer remain on the substrate after treatment in the areas in which contact is to be made. With a solar cell, this would mean that the porous layer is removed up to the Al—Si eutectic formed during sintering.

The invention-specific teaching is aimed at the layer being treated so that a suitable primer surface is available, that can be soldered on or on which a solderable layer is applied. This can, for example, be a tin-plate layer.

Naturally, soldering can be replaced by another type of attachment that makes possible a continuous-material connection, such as welding or adhesive bonding.

Compacting or complete or partial remelting also includes a complete or partial phase transformation, so that various alloys or alloy concentrations result.

In particular, the invention-specific process is used with a solar cell as an electronic component which contains a first layer consisting of a semiconductor material as a substrate, a second layer running on it as the sintered porous layer made of aluminum or containing aluminum, at least two intermediate layers running between the first and second layers made of materials of the first and second layers, wherein the first intermediate layer facing the second layer can contain a eutectic mixture of the materials of the first and second layers, and the contact area forming an electrically conducting connection with the first layer and extending from the second layer or interspersing with it through contactless compaction and/or removing of material of the electrically conducting contact area forming the second layer, wherein after compaction and/or removal of the material of the porous layer in the contact area, it is attached in electrically conducting fashion with a connector, especially by soldering such as ultrasonic soldering.

BRIEF DESCRIPTION OF THE DRAWINGS

Further particulars, advantages and features of the invention are drawn not only from the claims, and the features to be taken from them—as such and/or in combination—but also from the following description of a preferred embodiment example to be taken from the drawings.

Shown in the drawings are:

FIG. 1 a schematic representation of a semiconductor element in cross section;

FIG. 2 a schematic representation of a semiconductor element after treatment according to a first embodiment of the invention;

FIG. 3 a schematic representation of a semiconductor element after treatment according to a second embodiment of the invention;

FIG. 4 a schematic representation of a semiconductor element after treatment according to a third embodiment of the invention;

FIG. 5 a schematic representation of a semiconductor element after treatment according to a fourth embodiment of the invention; and FIG. 6 a schematic representation of a semiconductor element after treatment according to a fifth embodiment of the invention.

DESCRIPTION OF THE PREFERRED EMBODIMENTS

Purely in principle, a section of a semiconductor component is to be taken from the figures, which for reasons of simplicity is designated in what follows as a solar cell. Depicted are a substrate 10 consisting of silicon, thus a semiconductor material layer—designated in what follows as a semiconductor layer—on the front side of which, in customary fashion, semiconducting layers may be applied to form a p-n junction and front contacts and if necessary passivation layers. However, reference is made to sufficiently known constructions and structures of semiconductor components like solar cells, without needing more detailed explanations.

On semiconductor layer 10 designated as the first layer, by means of screen printing, pad printing, or thermal spraying, for example, a layer made of aluminum or containing aluminum is applied. This layer is designed as the aluminum layer or merely layer in what follows. During manufacture of the solar cell, the layer is sintered, resulting in an outer sintered aluminum layer 12 as the second layer. Between sintered aluminum layer 12 and silicon substrate 10, during manufacture, a silicon layer 14 doped with aluminum forming the back field surface and an aluminum layer 16 doped with silicon with an Al—Si eutectic 18 are formed. However, here likewise reference is made to sufficiently known prior art. The aluminum layer 16 doped with silicon is designated as the first intermediate layer and the silicon layer doped with aluminum is designated as second intermediate layer 14.

The outer or second layer 12 consisting of aluminum is porous due to the sintering process and consequently has a multiplicity of cavities.

To be noted about layers 10, 12 and intermediate layers 14, 16 including eutectic 18 is that these are shown as drawings as purely schematic, without reflecting the actual dimensions.

To solder a connector like a copper connector for contact on sintered aluminum layer 12 designated as the second layer, a contact area 20 is formed in sintered layer 12, which, according to the invention, occurs especially by non-contact compacting or removal of the aluminum material by means of concentrated electromagnetic radiation, which is located in the area of layer 12 by forming contact area 12.

For non-contact compacting or removal, a solid-state laser such as a Nd:YVO$_4$ laser can be used, one that has yttrium vanadate as the host crystal. The host crystal may also be yttrium-aluminum-garnet (YAG), so that a Nd:YAG solid state laser is used. For doping, preferably neodymium is used, so that a solid state laser with a wavelength of 1064 nm is available. If necessary, erbium, ytterbium or another element can be used for doping the laser. A neodymium-doped yttrium vanadate laser (Nd:YVO4 laser) or a neodymium-doped YAG (Nd:YAG laser) is especially preferred.

To force a desired profile on the laser radiation, optical devices for beam expansion of an aperture or an optical beam conversion system like refractive or diffractive optics can be placed in the beam path.

Through the measures in this regard, contact areas 20 can be deliberately formed in porous aluminum layer 12, which make possible a mechanically stable circuitry by means of known connection techniques such as ultrasonic soldering. Especially an impingement occurs with concentrated electromagnetic radiation to an extent that a contact area results from an aluminum layer, which is highly compacted, partially compacted or provided with a compaction gradient over the thickness of the previously porous layer (FIGS. 1, 4, 5) and has a scratch-proof aluminum surface if necessary, which results in good mechanical adherence.

However, it does not depart from the invention if, in the contact area to be formed, the material of the second layer 12, including layers 16 and 18 if necessary, or only including layer 16 (FIGS. 2, 3), is fully vaporized and thus contacting occurs immediately below intermediate layer 16 adjoining outer layer 12. The various possibilities that are produced based on the invention-specific teaching, are to be taken fundamentally from FIGS. 2 to 6. Again the invention-specific procedures are explained using a solar cell, so that identical reference symbols are used for identical elements.

FIGS. 2 and 3 make clear that to make a contact area 20 available, sintered aluminum layer 12 (FIG. 2) or it together with adjoining aluminum layer 16 doped with silicon can be removed (FIG. 3).

FIGS. 4 and 5 show in principle that to the desired extent the sintered aluminum layer 12 can be compacted to form a contact area 20, which has the desired mechanical stability to undertake a contact. According to the embodiment example of FIG. 4, sintered layer 12 is compacted with different degrees of compaction in areas 22 and 24. According to the embodiment example of FIG. 5, sintered layer 12 in contact area 2 is gradually increasingly compacted from the outside inwards. A compaction gradient is present.

Finally, there also exists a possibility to remove an area of a layer—sintered aluminum layer 12 in the embodiment example—and to compact a part that remains. The relevant areas are designated in FIG. 6 with reference numbers 26 (removed area) and 28 (compacted area).

In the embodiment examples, in or below layer 12, a single contact area 20 is depicted, but naturally within the scope of the connections needed, an appropriate number of contact areas can be produced according to the invention-specific teaching.

Independent of what is above, note is made that the invention-specific procedure does not of necessity need to be applied only to the rear sides of semiconductor elements like solar cells. Rather, the same holds true for the front sides.

Provision is further made that the invention-specific compaction and/or removal or removal and/or compaction should occur especially exclusively in areas in which connections are made with a connector like a cell connector. Also, the previously formed sintered porous aluminum layer preferably extends along the entire rear side of the solar cell.

It is also pointed out that after use of the invention-specific process, in supplemental fashion one or more layers can be applied to the treated areas, before the actual soldering or connecting process is carried out.

To a certain degree, the morphology of the compacted layer represents a proof that this invention is used, if customarily partial areas of the aluminum layer considered have higher compaction or compaction gradients vis-à-vis areas not treated.

Also, to a certain degree, the lack of a porous layer represents proof that this invention is used, if, for example, partial areas of the aluminum layer considered are partially or totally lacking vis-à-vis areas not treated.

What is claimed is:

1. A process for forming at least one local contact area of a substrate of an electrical component for contacting the contact area with a connector, wherein the substrate, on the contact side, is provided with a sintered porous layer consisting of aluminum or comprising aluminum, said process comprising one of the following steps (a)-(c):
   (a) partially removing and partially compacting the sintered porous layer by concentrated electromagnetic radiation in the contact area to be formed; or
   (b) compacting the sintered porous layer by concentrated electromagnetic radiation in at least one area of the contact area to be formed, resulting in areas with differing; or
   (c) first removing the sintered porous layer in the contact area to be formed on the outer side, and then compacting the remaining area, said removing and compacting being carried out by concentrated electromagnetic radiation.

2. A process according to claim 1, wherein the sintered porous layer is impinged on by concentrated electromagnetic radiation at a wavelength λ of 200 nm≦λ≦11,000 nm.

3. A process according to claim 1, wherein the sintered porous layer in the contact area to be formed is impinged on by laser radiation with a wavelength λ≧800 nm.

4. A process according to claim 3, wherein the laser radiation has a wavelength λ≧1000 nm.

5. A process according to claim 1, wherein for generation of the concentrated electromagnetic radiation, a neodymium-doped solid state laser with a wavelength of λ=1064 nm or an yttrium-aluminum-garnet or an yttrium-vanadate solid state laser, or a neodymium-doped yttrium-aluminum garnet laser or a neodymium-doped yttrium vanadate laser is used, said laser having a beam.

6. A process according to claim 5, wherein the laser emits laser radiation at which the optical absorption of the sintered porous layer is at least 0.5%.

7. A process according to claim 6, wherein the optical absorption of the sintered porous layer is in a range between 10% and 100%.

8. A process according to claim 5, wherein a laser is used which emits laser radiation at a wavelength which is absorbed by the porous layer for heating of it, so that the porous material in the area of the impinging laser radiation is vaporized for formation of the contact area.

9. A process according to claim 5, wherein for formation of the contact area, the laser is used in pulsed mode or in Q-switched mode.

10. A process according to claim 5, wherein for formation of the contact area the laser beam is forced into a top-hat shaped beam profile.

11. A process according to claim 5, wherein for influencing the beam of the laser, between the laser and the layer a beam conversion device is placed such as refractive or diffractive optics or an aperture.

12. A process according to claim 5 wherein the laser is pulsed by an opto-acoustic switch.

13. A process according to claim 1, wherein a solar cell is used as an electronic component which contains a first layer consisting of a semiconductor material as a substrate, a second layer running on it as the sintered porous layer made of aluminum or containing aluminum, at least two intermediate layers running between the first and second layers made of materials of the first and second layers, wherein the first intermediate layer facing the second layer can contain a eutectic mixture of the materials of the first and second layer, and the contact area forming an electrically conducting connection with the first layer, wherein after compaction and/or removal of the material of the porous layer in the contact area, the solar cell is attached in electrically conducting fashion with a connector.

14. A process according to claim 13, wherein the solar cell is attached with a connector by soldering.

15. A process according to claim 1, wherein after compaction and/or removal of the porous layer, in the area in question one or more layers are applied, with which contacting is carried out.

* * * * *